US012718863B2

(12) United States Patent
Wu et al.

(10) Patent No.: US 12,718,863 B2
(45) Date of Patent: Aug. 25, 2026

(54) STORAGE CIRCUIT WITH GAIN-CELL AND SELF-REFRESH UNIT CONNECTED BETWEEN GAIN-CELL AND LATCH CIRCUIT

(71) Applicants: Taiwan Semiconductor Manufacturing Company, Ltd., Hsinchu (TW); National Tsing Hua University, Hsinchu City (TW)

(72) Inventors: Jui-Jen Wu, Hsinchu (TW); Ping-Chun Wu, Hsinchu (TW); Win-San Khwa, Taipei City (TW); Meng-Fan Chang, Taichung City (TW)

(73) Assignees: Taiwan Semiconductor Manufacturing Company, Ltd., Hsinchu (TW); National Tsing Hua University, Hsinchu City (TW)

( * ) Notice: Subject to any disclaimer, the term of this patent is extended or adjusted under 35 U.S.C. 154(b) by 179 days.

(21) Appl. No.: 18/418,355

(22) Filed: Jan. 22, 2024

(65) Prior Publication Data

US 2025/0239289 A1 Jul. 24, 2025

(51) Int. Cl.

| | |
|---|---|
| ***G11C 11/406*** | (2006.01) |
| ***G11C 11/4093*** | (2006.01) |
| ***G11C 11/4094*** | (2006.01) |
| ***G11C 11/4096*** | (2006.01) |

(52) U.S. Cl.

CPC .... *G11C 11/40615* (2013.01); *G11C 11/4093* (2013.01); *G11C 11/4094* (2013.01); *G11C 11/4096* (2013.01)

(58) Field of Classification Search

CPC .......... G11C 11/40615; G11C 11/4093; G11C 11/4094; G11C 11/4096; G11C 11/405; G11C 11/406

See application file for complete search history.

(56) References Cited

U.S. PATENT DOCUMENTS

| | | | | |
|---|---|---|---|---|
| 6,370,612 B2 * | 4/2002 | Feierbach | G11C 29/54 | 711/106 |
| 6,453,400 B1 * | 9/2002 | Maesako | G11C 7/103 | 711/206 |
| 2007/0217260 A1 * | 9/2007 | Kitagawa | G11C 11/4097 | 365/185.05 |
| 2017/0075576 A1 * | 3/2017 | Cho | G11C 11/005 | |

* cited by examiner

*Primary Examiner* — Sultana Begum
(74) *Attorney, Agent, or Firm* — JCIPRNET

(57) ABSTRACT

In this disclosure, a storage circuit is provided. The storage circuit includes a gain-cell, a self-refresh unit, and a latch circuit. The gain-cell is configured to store first data in a gate of a storage transistor. The self-refresh unit is configured to read the first data from the gain-cell and write the first data back to the gain-cell. The latch circuit is configured to read the first data from the self-refresh unit and latch the first data.

20 Claims, 8 Drawing Sheets

STORAGE CIRCUIT WITH GAIN-CELL AND SELF-REFRESH UNIT CONNECTED BETWEEN GAIN-CELL AND LATCH CIRCUIT

BACKGROUND

Technical Field

The disclosure relates to a storage circuit; particularly, the disclosure relates to a storage circuit, a self-refresh unit, and a memory array.

Description of Related Art

Computing-in-memory (CIM) or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, CIM allows data to be analyzed in real time, enabling faster reporting and decision-making in business and machine learning applications. Efforts are ongoing to improve the performance of CIM systems.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
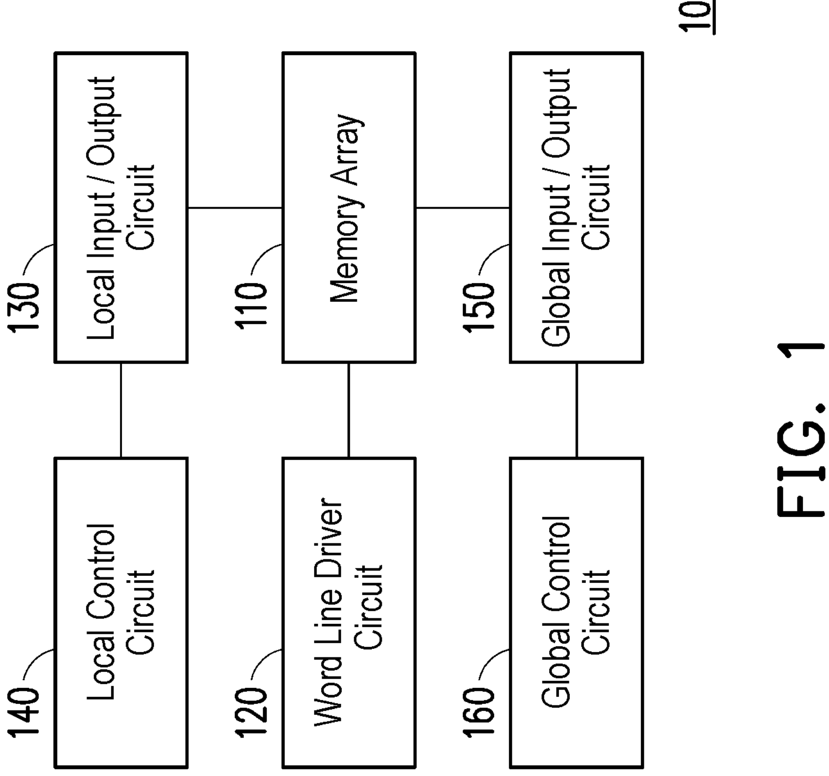
FIG. 1 is a schematic block diagram of a memory device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

Computing-in-memory (CIM) or in-memory computing systems store information in the main RAM of computers and perform calculations at memory cell level, rather than moving large quantities of data between the main RAM and data store for each computation step. Because stored data is accessed much more quickly when it is stored in RAM, CIM allows data to be analyzed in real time, enabling faster reporting and decision-making in business and machine learning applications. Efforts are ongoing to improve the performance of CIM or in-memory computing systems.

In some embodiment, data stored in a memory cell may be actually charges stored on a capacitor. It is noted that, since leakage current may slowly discharge a storage node holding the data, it is necessary to maintain the data by restoring a voltage level of the storage node. A sense amplifier is a circuit that may be used to restore the voltage level in the memory cell and prevent data loss due to leakage. However, the sense amplifier requires complex control circuitry and occupies a large area. Further, while a refresh operation or a write operation is performed on the memory cell through the sense amplifier for the data maintenance, a read operation may be not be able to be performed on the memory cell at the same time, which brings limitation in the CIM application. Therefore, it is the pursuit of people skilled in the art to provide an efficient way to maintain a storage state of the memory cell.

FIG. 1 is a schematic block diagram of a memory device according to an embodiment of the disclosure. With reference to FIG. 1, a memory device 100 may be a non-volatile memory, such as a dynamic random access memory (DRAM). However, this disclosure is not limited thereto. As shown in FIG. 1, the memory device 100 may include at least one memory array 110, as well as a plurality of peripheral circuits such as a word line (WL) driver circuit 120, a local input/output (IO) circuit 130, a local control circuit 140, a global IO circuit 150, and a global control circuit 160. In some embodiments, the memory device 100 may include other components not shown in FIG. 1. In some embodiments, the memory device 100 may be part of an integrated circuit (IC) chip.

In one embodiment, the memory array 110 may include a number of memory cells (also referred to as gain-cells) arranged in a matrix of rows and columns. Each of the memory cells may be operative to store one bit of information (such as '0' or '1'). For example, in some implementations, each memory cell may use four transistors (4T) connected between a first reference potential and a second reference potential (typically ground) such that a storage node may be occupied by the information to be stored. However, this disclosure is not limited thereto. The process of storing information to the memory array 110 is known as "writing". The process of reading information stored on the memory array 110 is known as "reading". Further, each memory cell may be electrically connected to a word line and a bit line. A word line may be operative to activate access to the memory cells of a row electrically connected to the word line. The bit line may be operative to access information stored or to be stored in the memory cells activated by the word line. Although the memory device 100 is shown to include only one memory array 110 for ease of discussion, the memory device 100 may include multiple memory arrays 110.

In some embodiments, the peripheral circuits may be included in the memory device 100 to provide various functions of the memory device 100 associated with the memory array 110. For instance, the word line driver circuit 120 of the memory device 100 may be operative to select a word line of the memory array 110 and charge the selected word line to a logic high. The logic high may be approximately equal to the first reference potential. In example embodiments, the word line driver circuit 120 may be a decoder circuit that includes a plurality of logic operators to decode potentials on address lines to identify a word line to activate. The address lines may be charged to logic high (that is, approximately equal to the first reference potential) or logic low (that is, approximately equal to the second reference potential). In example embodiments, the second reference potential may be approximately equal to the ground potential or zero volts. The logic high may be represented by bit 1 and the logic low is represented by bit 0.

The local IO circuit 130 of the memory device 100 may be operative to read data from and write data into the bit lines of the memory array 110. The local control circuit 140 of the memory device 100 may be operative to control the local IO circuit 130. For example, the local control circuit 140 may be operative to configure the local IO circuit 130 in a read mode to read information from the memory array 110 or in a write mode to write information into the memory array 110. In addition, the local control circuit 140 may be operative to enable the local IO circuit 130 in a hold mode where no data is read from or written into memory array 110.

The global IO circuit 150 of the memory device 100 may be operative to combine input/output from the local IO circuits 130. For example, the memory device 100 may include multiple memory arrays 110 each having a respective local IO circuit 130. The global control circuit 160 of the memory device 100 may be operative to control the global IO circuit 150. For example, the global control circuit 160 may be operative to configure the global IO circuit 150 to select one or more local IO circuits 130 to read data from or write data into.

Figure 2:
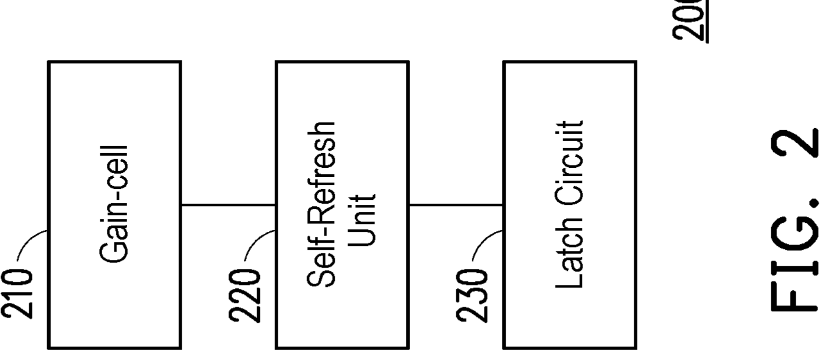
FIG. 2 is a schematic block diagram of a storage circuit according to an embodiment of the disclosure.

FIG. 2 is a schematic diagram of a storage circuit according to an embodiment of the disclosure. With reference to FIG. 2, a storage circuit 200 may include a gain-cell 210, a self-refresh unit 220, and a latch circuit 230. In one embodiment, the storage circuit 200 may be included in the memory device 100 of FIG. 1 and the gain-cell 210 may be one of the memory cells of the memory array 110 of FIG. 1. However, this disclosure is not limited thereto.

In one embodiment, the gain-cell 210 may be configured to store first data in a gate of a storage transistor. Further, the self-refresh unit 220 may be configured to read the first data from the gain-cell and write the first data back to the gain-cell. Furthermore, the latch circuit may be configured to read the first data from the self-refresh unit 220 and latch the first data.

In this manner, while a refresh operation or a write operation is performed on the gain-cell 210 through the self-refresh unit 220 for the data maintenance, a read operation may be able to be performed on the gain-cell 210 through the latch circuit 230 at the same time, which brings benefits in the CIM application. Moreover, the gain-cell 210 and the self-refresh unit 220 may not occupy large areas, thereby decreasing an area overhead of the memory device 100.

In one embodiment, the gain-cell 210 may be a special type of a basic storage unit in a DRAM that stores one bit of data. It is noted that, at the storage node, while most memory cells of DRAM utilize extra capacitors for the storage capacitance, the gain-cell 210 utilizes parasitic capacitors of a gate of a transistor for the storage capacitance. That is, no extra capacitors may be needed, thereby decreasing the area overhead. In some embodiment, a gain-cell 210 may include three transistors (3T): a storage transistor, a read transistor, and a write transistor. However, this disclosure is not limited thereto. The storage transistor may be used to store the data, while the read transistor and write transistor may be used to access the data.

For example, data may be stored in the gain-cell 210 by applying a voltage to the gate of the storage transistor. This voltage either turns the storage transistor on or off, which determines whether or not current can flow through the storage transistor. If the transistor is on, then the data stored at the storage node may be "1". On the other hand, if the transistor is off, then the data stored at the storage node may be "0". Further, the read transistor may be configured to read the data stored in the gain-cell 210. When the read transistor is on, the read transistor connects the gate of the storage transistor to a read bit line, which allows a voltage on the read bit line to be read by a memory controller. Furthermore, the write transistor may be configured to write data to the gain-cell 210. When the write transistor is on, the write transistor connects the gate of the storage transistor to a write bit line, which allows a voltage on the write bit line to be written to the gate of the storage transistor, thereby changing a state of the storage transistor and stores a new data bit.

In addition, an additional transistor may be included in the gain-cell 210 for providing extra capacitance. That is, one gain-cell 210 may include four transistors (4T) instead of three transistors (3T). However, this disclosure is not limited thereto. The additional transistor may be called as an enhance transistor. Further, the four transistors may be metal oxide semiconductor field effect transistors (MOSFET), but this disclosure is not limited thereto. Furthermore, for the ease of explanation, in the following embodiments, one of a source and a drain of a transistor may be described as a first terminal of the transistor and the other one of the source and the drain of the transistor may be described as a second terminal of the transistor. That is, the first terminal and the second terminal may be interchangeable. However, this disclosure is not limited thereto. In one embodiment, a gate of the enhance transistor may be electrically coupled to the storage node of the gain-cell 210 (i.e., the gate of the storage transistor) and a source and a drain of the enhance transistor may be electrically coupled to a ground voltage. By adding the enhance transistor, the storage capacitance of the storage node may increase, thereby preventing data loss due to leakage.

Figure 3:
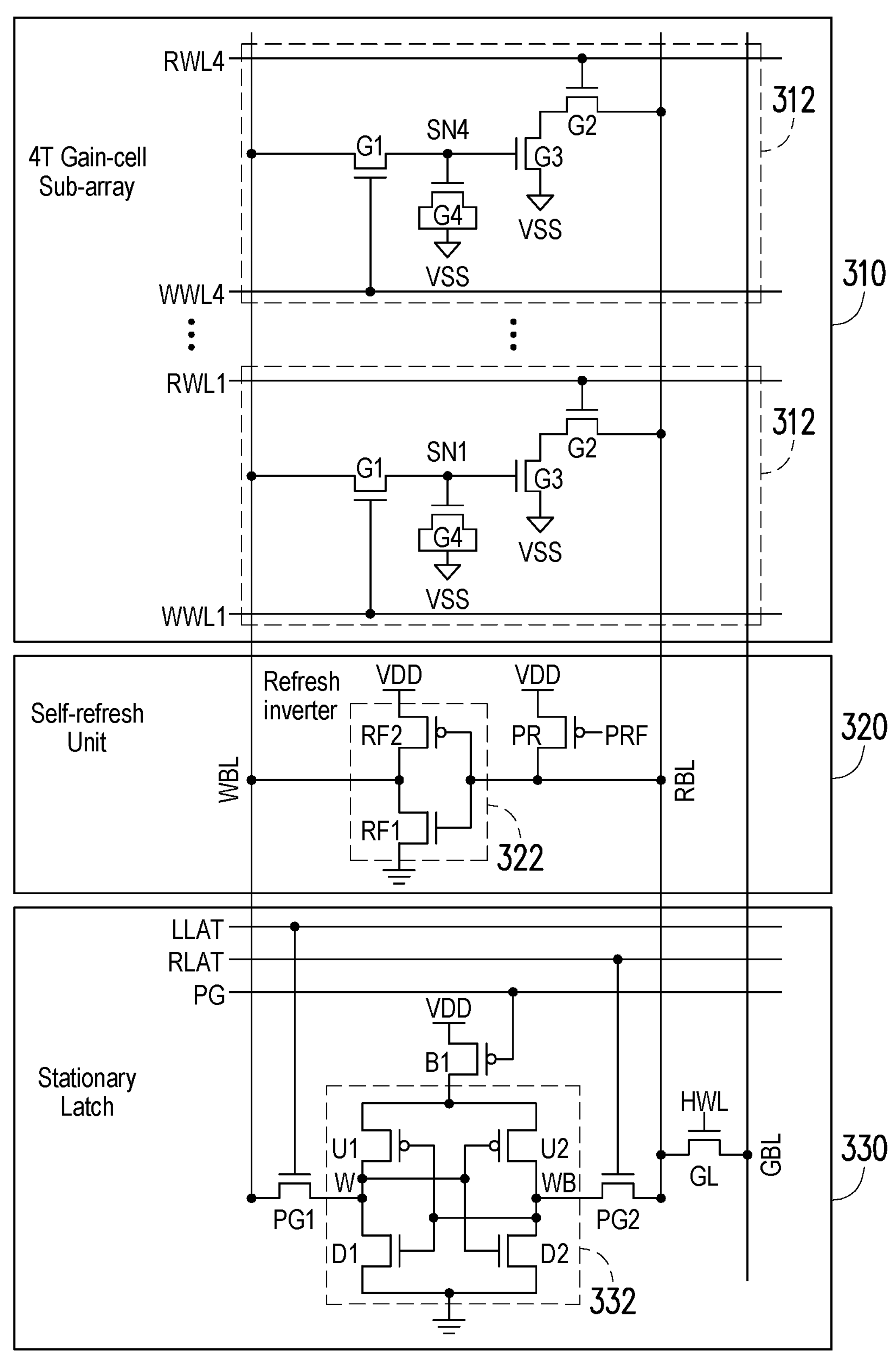
FIG. 3 is a schematic diagram of a storage circuit according to an embodiment of the disclosure.

FIG. 3 is a schematic diagram of a storage circuit according to an embodiment of the disclosure. With reference to FIG. 3, a storage circuit 300 may include a 4T gain-cell sub-array 310, a self-refresh unit 320, and a stationary latch 330. The 4T gain-cell sub-array 310 may include four gain-cells 312. The self-refresh unit 320 may include a refresh inverter 322. It is worth mentioned that, the gain-cell 312 may be an exemplary embodiment of the gain-cell 210, the self-refresh unit 320 may be an exemplary embodiment of the self-refresh unit 220, and the stationary latch 330 may be an exemplary embodiment of the latch circuit 230. However, this disclosure is note limited thereto. Moreover, while it is described for the sake of convenience in explanation that four gain-cells are included in the storage circuit 300, it is to be noted that the storage circuit 300 may include more than four gain-cells. In addition, transistors of the storage circuit 300 may be biased by a first reference potential VDD or a second reference potential VSS. The second reference potential VSS may be a ground voltage, but this disclosure is not limited thereto.

In one embodiment, the storage circuit 300 may be a column of a storage array. The storage array may include a plurality of gain-cells 312 arranged in a matrix of rows and columns. Each column of the storage array may include a sub-array, the self-refresh unit 320, and the stationary latch 330. The sub-array may include a number of gain-cells 312 and the self-refresh unit 320 may be configured to access the gain-cells 312 for restoring voltage levels of the gain-cells. In addition, the stationary latch 330 may be configured to obtain data from the self-refresh unit 320 and provide the data as weight data for CIM applications.

In one embodiment, each of the gain-cells 312 may include a first gain-cell transistor G1, a second gain-cell transistor G2, a third gain-cell transistor G3, and a fourth gain-cell transistor G4 and these four transistors may be all N-type transistors. However, this disclosure is not limited thereto. The first gain-cell transistor G1 may be also known as the write transistor, the second gain-cell transistor G2 may be also known as the read transistor, the third gain-cell transistor G3 may be also known as the storage transistor, and the fourth gain-cell transistor G4 may be also known as the enhance transistor.

That is, these four transistors may cooperative together to store information in the gain-cell 312. For example, the gain-cell 312 coupled to a read word line RWL1 and a write word line WWL1 may be configured to store information at a storage node N1. Similarly, the gain-cell 312 coupled to a read word line RWL4 and a write word line WWL4 may be configured to store information at a storage node N4.

Specifically, a gate of the first gain-cell transistor G1 may be electrically coupled to the write word line WWL, a first terminal (e.g., one of a source and a drain) of the first gain-cell transistor G1 may be electrically coupled to a write bit line WBL, and a second terminal (e.g., (the other one of the source and the drain) of the first gain-cell transistor G1 may be electrically coupled to a gate of the fourth gain-cell transistor G4 and a gate of the third gain-cell transistor G3. Further, both of a source and a drain of the fourth gain-cell transistor G4 may be electrically coupled to the second reference potential VSS. Furthermore, a first terminal of the third gain-cell transistor G3 may be electrically coupled to the second reference potential VSS and a second terminal of the third gain-cell transistor G3 may be electrically coupled to a source and a drain of the second gain-cell transistor G2. Moreover, a second terminal of the second gain-cell transistor G2 may be electrically coupled to a read bit line RBL. In addition, the write bit line WBL may be operative to provide information be stored to the storage node SN1 through the first gain-cell transistor G1 activated by the write word line WWL1. On the other hand, the read bit line RBL may be operative to access information stored in the storage node SN1 through the second gain-cell transistor G2 activated by the write word line RWL1.

In one embodiment, the self-refresh unit 320 may include a refresh inverter 322 and a pre-charge transistor PR. The refresh inverter 322 may include a first refresh transistor RF1 and a second refresh transistor RF2. The first refresh transistor RF1 may be an N-type transistor and the second refresh transistor RF2 may be a P-type transistor. The pre-charge transistor PR may be a P-type transistor. In one embodiment, the refresh inverter 322 may be electrically coupled between the first reference potential VDD and the second reference potential VSS. Further, the pre-charge transistor PR may be configured to pre-charge the read bit line RBL to the first reference potential VDD during a latch operation of the stationary latch 330 and discharge the write bit line WBL to the second reference potential VSS during the latch operation of the stationary latch 330.

That is, the self-refresh unit 320 may be a three transistor (3T) structure, which may automatically write the data back to write bit line WBL after reading out from the gain-cell 312, to restore the stored data and maintain the voltage level of the stored data.

Specifically, a first terminal of the first refresh transistor RF1 may be electrically coupled to a ground voltage or the second reference potential VSS. A second terminal of the first refresh transistor RF1 may be electrically coupled a first terminal of the second refresh transistor RF2 and may be also electrically coupled to the write bit line WBL. A second terminal of the second refresh transistor RF2 may be electrically coupled to the first reference potential VDD. A gate of the first refresh transistor RF1 and a gate of the second refresh transistor RF2 may be electrically coupled to a first terminal of the pre-charge transistor PR and may be also electrically coupled to the read bit line RBL. A second terminal of the pre-charge transistor PR may be electrically coupled to the first reference potential VDD. A gate of the pre-charge transistor PR may be configured to receive a pre-charge signal PRE.

In one embodiment, the stationary latch 330 may include a cross-coupled latch 332, a first pass gate transistor PG1, and a second pass gate transistor PG2. The cross-coupled latch 332 may include a first pull up transistor U1, a first pull down transistor D1, a second pull up transistor U2, and a second pull down transistor D2. The first pass gate transistor PG1 and the second pass gate transistor PG2 may be N-type transistors. The first pull up transistor U1 and the second pull up transistor U2 may be P-type transistors and the first pull down transistor D1 and the second pull down transistor D2 may be N-type transistors. The cross-coupled latch 332 may further include a weight data node W and a weight data bar node WB.

That is, the stationary latch 330 may be able to latch data for CIM applications. By the self-refresh unit 320, after reading data from the gain-cell 312, complementary data may be placed on the read bit line RBL and the write bit line WBL. The pass gate transistors PG1, PG2 of the stationary latch 330 may be turned on at this time for a latch circuit write operation. For example, the cross-coupled latch 332 may include the weight data node W and the weight data bar node WB. Further, the first pass gate transistor PG1 may be electrically coupled between the cross-coupled latch 332 and the write bit line WBL and may be configured to provide data of the write bit line WBL to the weight data node W. Furthermore, the second pass gate transistor PG2 may be electrically coupled between the cross-coupled latch 332 and the read bit line RBL and may be configured to provide data of the read bit line RBL to the weight data bar node WB.

After the data being latched, the latched data may be used as a computing data source (such as weight data) for CIM computations, while another read operation, write operation, or refresh operation may be performed on the gain-cell 312 at the same time, which enables high-speed computations for the CIM applications. In other word, in response to the first data being latched in the stationary latch 330, the gain-cell 312 may be configured to store second data. Further, in response to the second data being stored in the gain-cell 312, the station latch 330 may be configured to provide the first data as a computing data source for a CIM application.

Specifically, a first terminal of the first pull down transistor D1 and a first terminal of the second pull down transistor may be electrically to the ground voltage. In one embodiment, the ground voltage may be the second reference potential VSS. However, this disclosure is not limited thereto. A second terminal of the first pull down transistor D1 may be electrically coupled to a first terminal of the first pull up transistor U1. Further, the second terminal of the first pull down transistor D1 may be electrically coupled to a first terminal of the first pass gate transistor PG1 and a second terminal of the first pass gate transistor PG1 may be electrically coupled to the write bit line WBL. Furthermore, the second terminal of the first pull down transistor D1 may be electrically coupled a gate of the second pull down transistor D2, a gate of the second pull up transistor U2, and the weight data node W. The second terminal of the second pull down transistor D2 may be electrically coupled to a first terminal of the second pull up transistor U2. Further, the second terminal of the second pull down transistor D2 may be electrically coupled to a first terminal of the second pass gate transistor PG2 and a second terminal of the second pass gate transistor PG2 may be electrically coupled to the read bit line RBL. Furthermore, the second terminal of the second pull down transistor D2 may be electrically coupled a gate of the first pull down transistor D1, a gate of the first pull up transistor U1, and the weight data bar node WB. A second terminal of the first pull up transistor U1 and a second terminal of the second pull up transistor U2 may be electrically coupled to the first reference potential VDD (directly or through the header transistor B1). A gate of first pass gate transistor PG1 may be electrically coupled to a left latch control signal LLAT and a gate of the second pass gate transistor PG2 may be electrically coupled to a right latch control signal RLAT.

In addition, a global connect transistor GL may be electrically coupled between the read bit line RBL and a global bit line GBL. Specifically, a first terminal of the global connect transistor GL may be electrically coupled to the read bit line RBL and a second terminal of the global connect transistor GL may be electrically coupled to the global bit line GBL. It is noted that, while it is depicted for the sake of convenience in explanation that the global connect transistor GL is included in the stationary latch 330, the global connect transistor GL may be not included in the stationary latch 330 and may be included in other circuit, such as the gain-cell 312 or the self-refresh unit 320. However, this disclosure is not limited thereto.

It is worth mentioned that, a gate of the global connect transistor GL may be configured to receive a horizontal word line control signal HWL. For example, in a read operation, the horizontal word line control signal HWL is enabled to turn on the global connect transistor GL to connect the global bit line GBL to the read bit line RBL. Then, the data to be read may be read out and be placed on the read bit line RBL and then the data may be transferred via global GBL to a global IO circuit. On the other hand, in a write operation, the horizontal word line control signal HWL is disabled to turn off the global connect transistor GL to connect the global bit line GBL to the write bit line WBL. Then, the data to be written may be placed on the global bit line GBL and then the data may be transferred to the write bit line WBL.

It is worth mentioned that, in order to improve a write ability of the stationary latch 330, driving currents of the first pull up transistor U1 and the second pull up transistor U2 of the cross-coupled latch 332 may be weaker than driving currents of the first pull down transistor D1 and the second pull down transistor D2 of the cross-coupled latch 332. Moreover, to further improve the write ability of the stationary latch 330, a header transistor B1 may be electrically coupled between the first reference potential VDD and the cross-coupled latch 332. Specifically, a first terminal of the header transistor B1 may be electrically coupled to the first reference potential VDD and a second terminal of the header transistor B1 may be electrically coupled to the cross-coupled latch 332. A gate of the header transistor may be configured to receive a pass gate signal PG. Based on the pass gate signal PG being high, the header transistor B1 may be turned off. That is, the cross-coupled latch 332 is disconnected to the first reference potential VDD, thereby further reducing the driving currents of the first pull up transistor U1 and the second pull up transistor U2 of the cross-coupled latch 332 and improving the write ability of the stationary latch 330. In other words, the pull up path may be blocked by the header transistor while the header transistor is turned off as a write assistant. Namely, the header transistor B1 may be electrically coupled between the cross-coupled latch 332 and the first reference potential VDD and may be configured to disconnect the cross-coupled latch 332 from the first reference potential VDD based on the pass gate signal PG. Since the pull-up path is blocked, it may become easier to write data to the stationary latch 330, which speeds up a writing of the stationary latch 330 and ensures a successful write operation of the stationary latch 330. However, the header circuit may be or may not be included in the stationary latch 330 according to design needs and this disclosure is not limited thereto.

Figure 4:
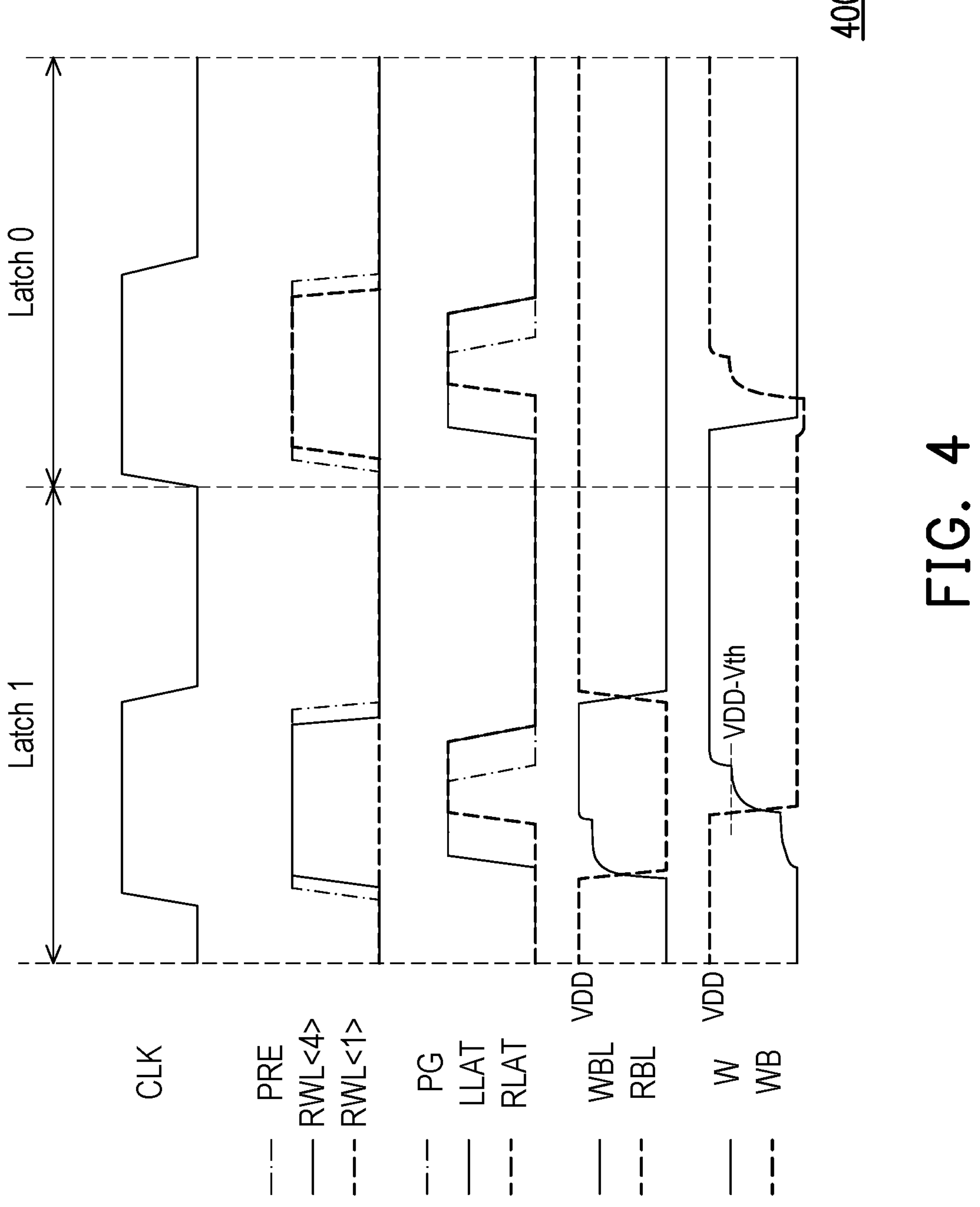
FIG. 4 is a schematic timing chart of a storage circuit according to an embodiment of the disclosure.

FIG. 4 is a schematic timing chart of a storage circuit according to an embodiment of the disclosure. With reference to FIG. 3 and FIG. 4, a timing chart 400 depicts some waveforms of the storage circuit 300. The timing chart 400 may include a clock signal CLK, the pre-charge signal PRE, a read word line control signal RWL<4>, a read word line control signal RWL<1>, the pass gate signal PG, the left latch control signal LLAT, the right latch control signal RLAT, the write bit line WBL, the read bit line RBL, the weight data node W, and the weight data bar node WB.

In one embodiment, the data stored in the storage node SN4 may be "1" and the data stored in the storage node SN1 may be "0". The timing chart 400 may include two parts: latching "1" from the storage node SN4 into the stationary latch 330 and latching "0" from the storage node SN1 into the stationary latch 330. Further, the clock signal CLK may be configured to provide a periodic waveform for synchronizing signals of the storage circuit 300.

In an operation of latching "1" into the stationary latch 330, the read word line control signal RWL<4> may be enabled to turn on the second gain-cell transistor G2 for reading data (i.e., "1") from the storage node SN4. After that, for writing data (i.e., "1") into the stationary latch 330, the pre-charge signal PRE may be enabled (e.g., switched to a logic high, such as the first reference potential VDD) to pre-charge the write bit line WBL to the logic high. As shown in FIG. 4, the write bit line WBL may be charged from a logic low (e.g., the second reference potential VSS) to the logic high, while the read bit line RBL may be discharged from the logic high to the logic low.

Next, the pass gate signal PG may be enabled to turn on the header transistor B1 for improving the write operation of the stationary latch 330. At the same time, the left latch control signal LLAT may be enabled to write the data read from the storage node SN4 (i.e., "1") into the weight data node W utilizing the logic high of the write bit line WBL. That is, the data node W may be then slowly charged from the logic low to the logic high. Afterwards, the right latch control signal RLAT may be enabled to write complementary data (i.e., "0") of the data read from the storage node SN4 into the weight data bar node WB utilizing the logic low of the read bit line RBL. That is, the weight data bar node WB may be then slowly discharged from the logic high to the logic low. It is noted that, a timing of the left latch control signal LLAT being switched to the logic high is earlier than a timing of the right latch control signal RLAT being switched to the logic high. In other words, during a latch operation, a timing of the first pass gate transistor PG1 being turned on may be earlier than a timing of the second pass gate transistor PG2 being turned on. Such timing difference is configured to prevent a writing from the read bit line RBL while the read bit line RBL is not yet discharged to the logic low.

After that, the stationary latch 330 may successfully latch the data read from the gain-cell 312 (i.e., "1") and the latched data may be ready to be used as computing data source for CIM applications. Then, the left latch control signal LLAT and the right latch control signal RLAT may be disabled. Next, since the pre-charge signal PRE is still enabled, the read bit line RBL may be pre-charged back to the logic high and the write bit line WBL may be discharged back to the logic low.

In an operation of latching "0" into the stationary latch 330, the read word line control signal RWL<1> may be enabled to turn on the second gain-cell transistor G2 for reading data (i.e., "0") from the storage node SN1. After that, for writing data (i.e., "0") into the stationary latch 330, the pass gate signal PG may be enabled to turn on the header transistor B1 for improving the write operation of the stationary latch 330. At the same time, the left latch control signal LLAT may be enabled to write the data read from the storage node SN1 (i.e., "0") into the weight data node W utilizing the logic low of the write bit line WBL. That is, the data node W may be then slowly discharged from the logic high to the logic low.

Afterwards, the right latch control signal RLAT may be enabled to write complementary data (i.e., "1") of the data read from the storage node SN1 into the weight data bar node WB utilizing the logic high of the read bit line RBL. That is, the weight data bar node WB may be then slowly charged from the logic low to the logic high. After that, the stationary latch 330 may successfully latch the data read from the gain-cell 312 (i.e., "0") and the latched data may be ready to be used as computing data source for CIM applications.

Figure 5B:
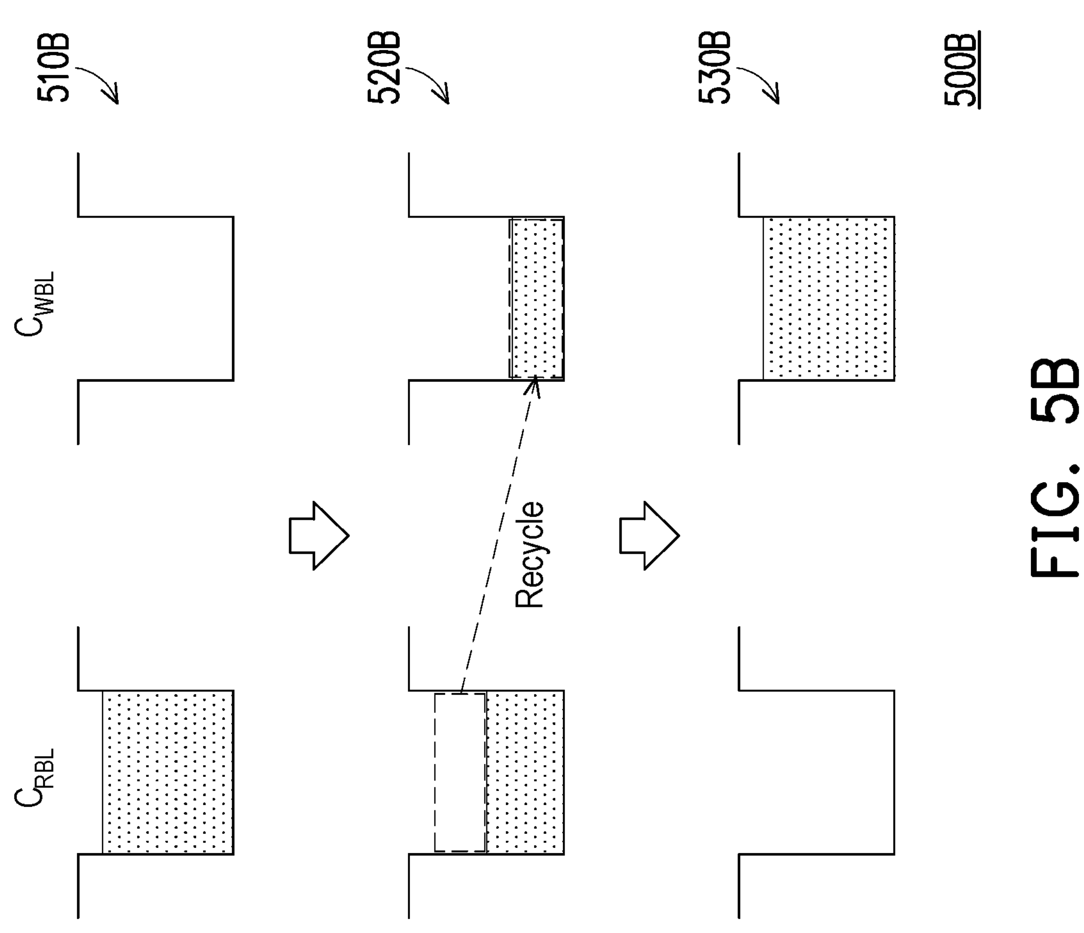
FIG. 5B is a schematic diagram of a charging recycling scenario according to an embodiment of the disclosure.
Figure 5A:
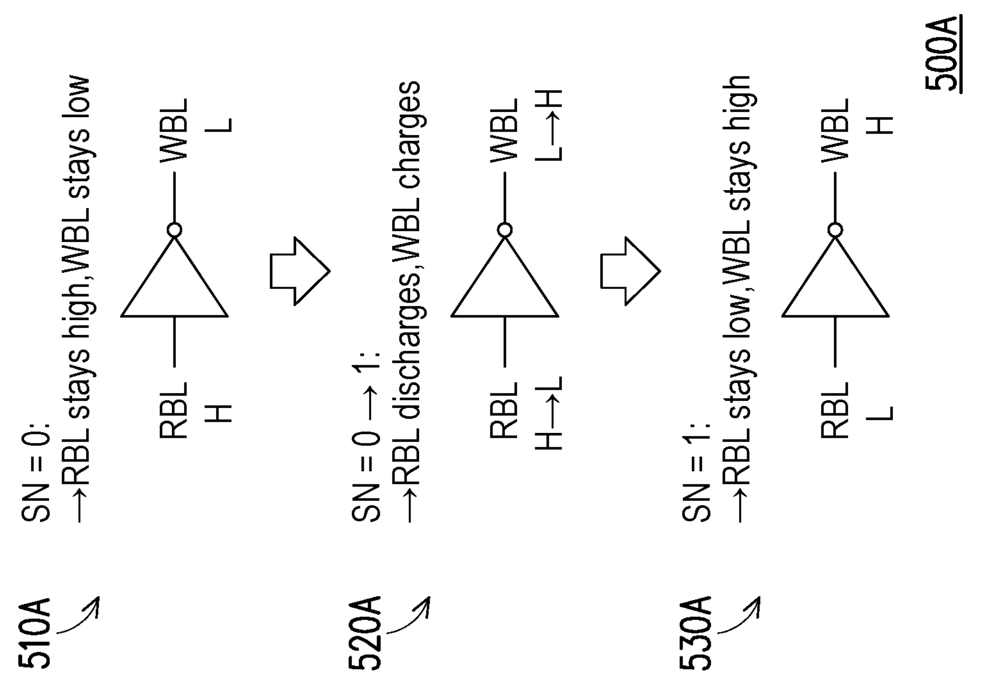
FIG. 5A is a schematic diagram of a charging scenario according to an embodiment of the disclosure.

FIG. 5A is a schematic diagram of a charging scenario according to an embodiment of the disclosure. FIG. 5B is a schematic diagram of a charging recycling scenario according to an embodiment of the disclosure. With reference to FIG. 5A and FIG. 5B, a charging scenario 500A depicts how the write bit line WBL may be charged utilizing the first reference potential VDD only and a charging recycling scenario 500B depicts how the write bit line WBL may be charged utilizing not only the first reference potential VDD but also charges from the read bit line RBL.

Reference is first made to FIG. 5A, at a first stage 510A, for writing "0" into in a storage node SN of the gain-cell 312 or refreshing "0" stored in the storage node SN of the gain-cell 312, the read bit line RBL may be pre-charged to a logic high and the write bit line WBL may be discharged to a logic low. That is, the read bit line RBL may stay high and the write bit line may stay low.

Next, at a second stage 520A, while writing "1" into the storage node SN of the gain-cell 312 is required, the read bit line RBL may be discharged and the write bit line WBL may be charged. For example, in order to switch a storage state of the storage node SN from "0" to "1", as shown in FIG. 3, the read bit line RBL may be discharged from the logic high to the logic low by the first refresh transistor RF1 coupled to the ground voltage. On the other hand, the write bit line WBL may be charged from the logic low to the logic high by the second refresh transistor RF2 coupled to the first reference potential VDD.

Afterwards, in a third stage 530A, after the writing "1" into the gain-cell 312 or the stationary latch 330, the read bit line RBL may stay low and the write bit line may stay high. That is, the write bit line WBL may be charged to the logic high through the first reference potential VDD only. That is, while the write bit line WBL is being charged, additional energy from power through the first potential VDD may be consumed.

It is noted that, while the read bit line RBL is being discharged, all the charges of the read bit line RBL may be discharged to the logic low through the ground voltage. However, if the charges of the read bit line RBL may be reused for charging the write bit line WBL, the additional energy from power for charging the write bit line WBL may be decreased.

Reference is now made to FIG. 5B, a read capacitance $C_{RBL}$ may represent a capacitance of the read bit line RBL and a write capacitance $C_{WBL}$ may represent a capacitance of the write bit line.

At a first stage 510B, while the read bit line RBL is pre-charged to the logic high and the write bit line WBL is discharged to the logic low, a charge level stored in the read capacitance $C_{RBL}$ may be at a high level and a charge level stored in the write capacitance $C_{WBL}$ may be at a low level.

At a second stage 520B, since the charge level of the read capacitance $C_{RBL}$ is higher than the charge level of write capacitance $C_{WBL}$, a charge balance operation may be performed on the read capacitance $C_{RBL}$ and write capacitance $C_{WBL}$. By performing the charge balance operation, the charge level of the read capacitance $C_{RBL}$ may be same as the charge level of the write capacitance $C_{WBL}$. That is, up to half of the charges stored in the read capacitance $C_{RBL}$ may be recycled and be provided to the write capacitance $C_{WBL}$ for charging the write capacitance $C_{WBL}$.

At a third stage 530B, after the charges of the read capacitance $C_{RBL}$ and the write capacitance $C_{WBL}$ are balanced, the charges in the read capacitance $C_{RBL}$ may continue to be discharged through the ground voltage. Meanwhile, the charges in the read capacitance $C_{RBL}$ may continue to be charged through the first reference potential VDD. In this manner, only half of the charges are from first reference potential VDD, thereby decreasing the additional energy from power for charging the write bit line WBL. That is, the overall energy required for charging the write bit line WBL may be reduced and a power efficiency of the storage circuit 300 may increase.

Figure 6:
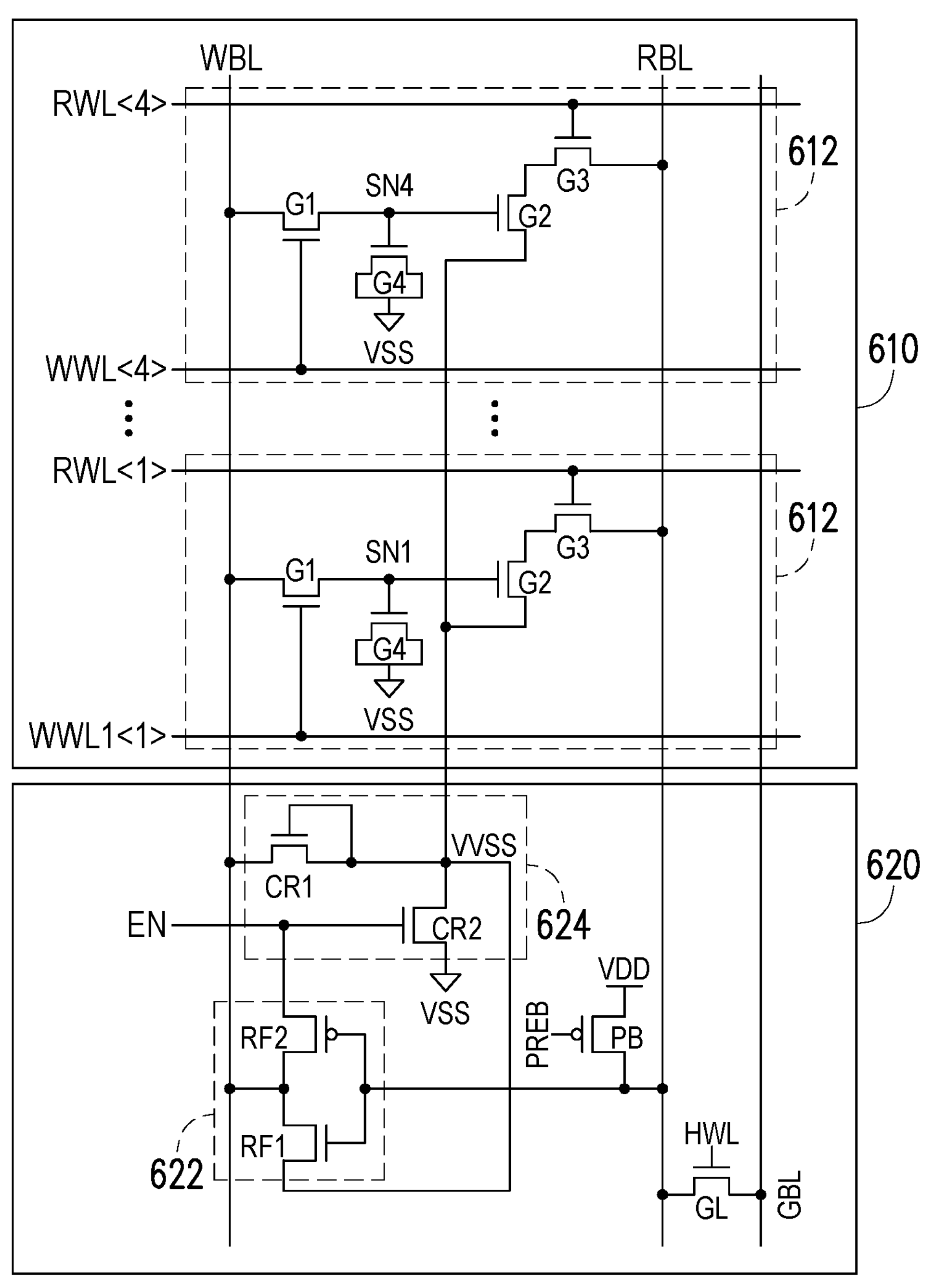
FIG. 6 is a schematic diagram of a storage circuit according to an embodiment of the disclosure.

FIG. 6 is a schematic diagram of a storage circuit according to an embodiment of the disclosure. With reference to FIG. 6, a storage circuit 600 includes a 4T gain-cell sub-array 610 and a self-refresh unit 620. The 4T gain-cell sub-array 610 may be referred to the 4T gain-cell sub-array 310, while the details are not redundantly described seriatim herein. Further, although the storage circuit 600 is shown to include only the 4T gain-cell sub-array 610 and the self-refresh unit 620 for ease of discussion, the storage circuit 600 may include the latch circuit 230, such as the stationary latch 330.

In one embodiment, the self-refresh unit 620 may not only include a refresh invertor 622 and a pre-charge transistor PB, but also include a charge recycling circuit 624. The refresh invertor 622 may be referred to the refresh invertor 322, while the details are not redundantly described seriatim herein. The pre-charge transistor PB may be a P-type transistor. The charge recycling circuit 624 may include a first charge recycling transistor CR1, a second charge recycling transistor CR2, and a charge recycling node VVSS. The first charge recycling transistor CR1 and the second charge recycling transistor CR2 may be N-type transistor. However, this disclosure is not limited thereto.

That is, by utilizing the charge recycling circuit 624, the charges in the read bit line RBL may be partially transferred to write bit line WBL to save additional energy. Further, in a final stage, the first refresh transistor RF1 and the second charge recycling transistor CR2 may respectively drive the write bit line WBL and the read bit line RBL to full voltage swing and complete the refresh operation. In other words, the charge recycling circuit 624 may be configured to receive charges from the read bit line RBL and provide the charges to the write bit line WBL. To put it briefly, the charge recycling circuit 624 may be configured to perform a charge balance operation between a charge level of the read bit line RBL and a charge level of the write bit line WBL.

Specifically, a first terminal of the first refresh transistor RF1 may be electrically coupled to the charge recycling node VVSS. A second terminal of the first refresh transistor RF1 may be electrically coupled a first terminal of the second refresh transistor RF2 and may be also electrically coupled to the write bit line WBL. A second terminal of the second refresh transistor RF2 may be electrically coupled to a gate of the second charge recycling transistor CR2 and configured to receive an enable signal EN. A gate of the first refresh transistor RF1 and a gate of the second refresh transistor RF2 may be electrically coupled to a first terminal of the pre-charge transistor PB and may be also electrically coupled to the read bit line RBL. A second terminal of the pre-charge transistor PB may be electrically coupled to the first reference potential VDD. A gate of the pre-charge transistor PB may be configured to receive a pre-charge bar signal PREB. Further, a first terminal of the first charge recycling transistor CR1 may be electrically coupled to the write bit line WBL. A gate of the first charge recycling transistor CR1 and a second terminal of the first charge recycling transistor CR1 may be electrically coupled to the charge recycling node VVSS. A first terminal of the second charge recycling transistor CR2 may be electrically coupled to the second reference potential VSS. A second terminal of the second charge recycling transistor CR2 may be electrically coupled to the charge recycling node VVSS. The gate of the second charge recycling transistor CR2 is electrically coupled to the second terminal of the second refresh transistor RF2 of the refresh inverter 622 and configured to receive an enable signal EN.

In addition, the global connect transistor GL may be electrically coupled between the read bit line RBL and a global bit line GBL. Specifically, a first terminal of the global connect transistor GL may be electrically coupled to the read bit line RBL and a second terminal of the global connect transistor GL may be electrically coupled to the global bit line GBL. It is noted that, while it is depicted for the sake of convenience in explanation that the global connect transistor GL is included in the self-refresh unit 620, the global connect transistor GL may be not included in the self-refresh unit 620 and may be include in other circuit, such as the gain-cell 612 or the stationary latch 330. However, this disclosure is not limited thereto.

Figure 7:
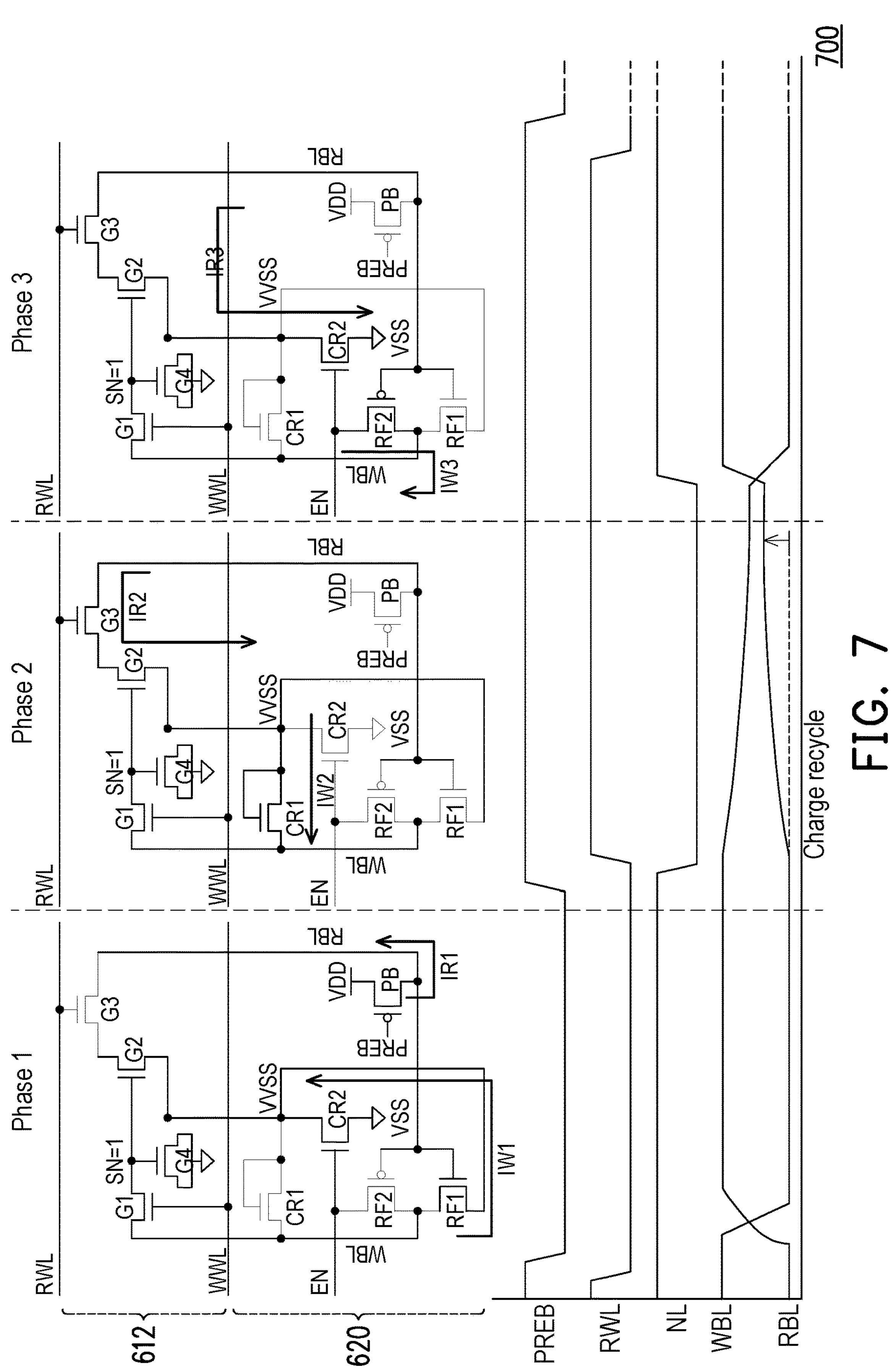
FIG. 7 is a schematic timing chart of a storage circuit according to an embodiment of the disclosure.

FIG. 7 is a schematic timing chart of a storage circuit according to an embodiment of the disclosure. With reference to FIG. 6 and FIG. 7, a timing chart 700 depicts some waveforms of the storage circuit 600. The timing chart 400 may include the pre-charge bar signal PREB, the read word line RWL, the enable signal EN, the write bit line WBL, and the read bit line RBL.

In one embodiment, referring to FIG. 5B and FIG. 6, the charge recycling scenario 500B may be achieved by the self-refresh unit of the storage circuit 600. Reference is now made to FIG. 7. The data stored in the storage node SN may be "1". In order to restore the voltage level of the storage node SN, a self-fresh operation may be performed by the self-refresh unit 620. Further, in order to reduce the energy consumption during the self-refresh operation, the charge recycling scenario 500B may be performed. In one embodiment, operations in the charge recycling scenario 500B may include three phases of operations. In a phase 1, a pre-charge operation may be performed. In a phase 2, a charge recycling operation may be performed. In a phase 3, the self-refresh operation may be performed.

In the phase 1, the pre-charge bar signal PREB may be switched to the logic low and the pre-charge transistor PB may be turned on. Through the pre-charge transistor PB, the first reference potential VDD may be provided to the gates of the first refresh transistor RF1 and the second refresh transistor RF2, and the first refresh transistor RF1 may be turned off and the second refresh transistor RF2 may be turned on. Further, the read word line RWL may be switched to the logic low and the third gain-cell transistor G3 may be turned off. Furthermore, the enable signal EN may be switched to the logic high and the second charge recycling transistor CR2 may be turned on. Through the second charge recycling transistor CR2, the second reference potential VSS may be provided and the first charge recycling transistor CR1 may be turned off. In addition, since the data stored in the storage node SN may be "1", the second gain-cell transistor G2 and the fourth gain-cell transistor G4 may be turned on.

Under such configuration, the read bit line RBL may be pre-charged to the first reference potential VDD through the pre-charge transistor PB electrically coupled to the first reference potential VDD utilizing the first read current IR1. On the other hand, the word bit line WBL may be discharged to the second reference potential VSS through the second charge recycling transistor CR2 coupled to the second reference potential VSS utilizing the first write current IW1. Therefore, the read bit line RBL may stay high and the write bit line WBL may stay low.

In the phase 2, the pre-charge bar signal PREB may be switched to the logic high and the pre-charge transistor PB may be turned off. Further, the read word line RWL may be switched to the logic high and the third gain-cell transistor G3 may be turned on. Through the third gain-cell transistor G3, the logic high of the read word line RWL may be provided and the first charge recycling transistor CR1 may be turned on. Furthermore, the enable signal EN may be switched to the logic low and the second charge recycling transistor CR2 may be turned off. In addition, since the data stored in the storage node SN may be "1", the second gain-cell transistor G2 and the fourth gain-cell transistor G4 may be turned on.

Under such configuration, the charge recycling node VVSS may be charged by the read bit line RBL through the third gain-cell transistor G3 electrically coupled to the read bit line RBL utilizing the second read current IR2. On the other hand, the word bit line WBL may be charged by the charge recycling node VVSS through the first charge recycling transistor CR1 coupled to the charge recycling node VVSS utilizing the second write current IW2. Therefore, the charges of the read bit line RBL may be reused for charging the write bit line WBL through the charge recycling node VVSS and the additional energy from power for charging the write bit line WBL may be decreased.

In the phase 3, the enable signal EN may be switched to the logic low and the second charge recycling transistor CR2 may be turned on. Through the second charge recycling transistor CR2, the second reference potential VSS may be provided and the first charge recycling transistor CR1 may be turned off. Similarly, through the second charge recycling transistor CR2, the second reference potential VSS may be provided and the first refresh transistor RF1 may be turned on.

Under such configuration, the read bit line RBL may be discharged to the second reference potential VSS through the second charge recycling transistor CR2 electrically coupled to the second reference potential VSS utilizing the third read current IR3. On the other hand, the word bit line WBL may be charged to the first reference potential VDD through the first refresh transistor RF1 coupled to the enable signal EN (which is at the logic high) utilizing the third write current IW3. Therefore, the read bit line RBL may stay low and the write bit line WBL may stay high, thereby restoring the voltage of the "1" stored at the storage node SN.

Figure 8:
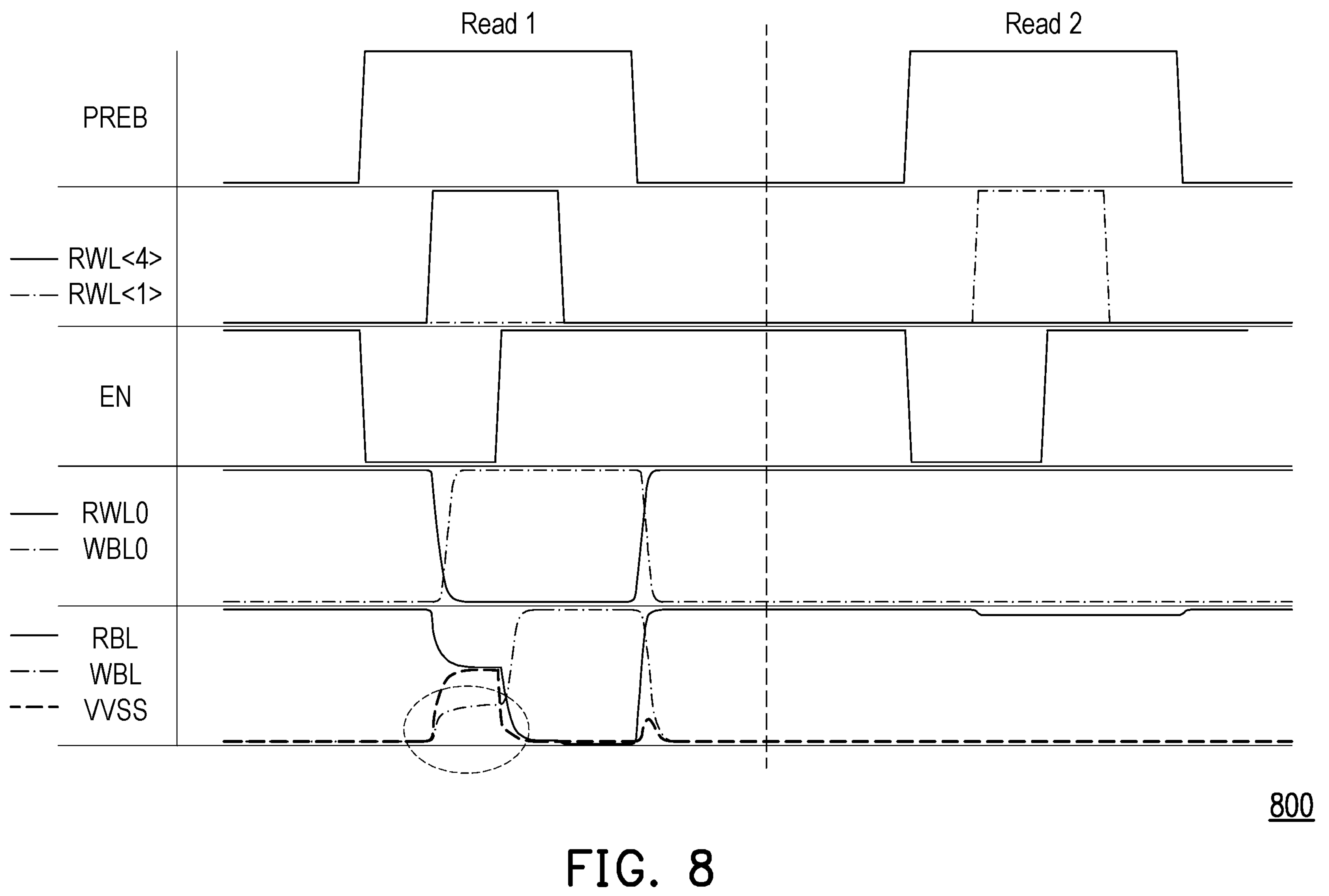
FIG. 8 is a schematic timing chart of a storage circuit according to an embodiment of the disclosure.

FIG. 8 is a schematic timing chart of a storage circuit according to an embodiment of the disclosure. With reference to FIG. 3, FIG. 6 and FIG. 8, a timing chart 800 depicts a comparison of the waveforms of the storage circuit 300 and the storage circuit 600. The timing chart 800 may include the pre-charge bar signal PREB, the read word line control signal RWL<4>, the read word line control signal RWL<1>, the enable signal EN, a read bit line RBL0, a write bit line WBL0, the read bit line RBL, the write bit line WBL, and the charge recycling node VVSS. It is noted that, the read bit line RBL0 and the write bit line WBL0 may correspond to the storage circuit 300 and the read bit line RBL and the write bit line WBL may correspond to the storage circuit 600.

In one embodiment, the data stored in the storage node SN4 may be "1" and the data stored in the storage node SN1 may be "0". The timing chart 800 may include two parts: reading "1" from the storage node SN4 and reading "0" from the storage node SN1.

In an operation of reading "1", the pre-charge bar signal PREB may be switched to the logic high to ensure that the read bit line RBL is pre-charged to the logic high. On the other hand, the enable signal EN may be switch to the logic low to ensure that the write bit line WBL is discharged to the logic low. Next, the read word line control signal RWL<4> may be enabled to turn on the second gain-cell transistor G2 for reading data (i.e., "1") from the storage node SN4.

In response to the data being read out from the storage node SN4, the read bit line RBL0 of the storage circuit 300 may be discharged to the logic low directly and the write bit line WBL0 of the storage circuit 300 may be charged to the logic low directly. On the other hand, in response to the data being read out from the storage node SN4, the read bit line RBL of the storage circuit 600 may be discharged to the charge recycling node VVSS. The charge recycling node VVSS may be charged and the write bit line WBL of the storage circuit 600 may be charged by the charges from the read bit line RBL through the charge recycling node VVSS.

Afterwards, the enable signal EN may be switched to the logic high, the read bit line RBL may be discharged to the logic low and the write bit line WBL may be charged to the logic high. That is, by utilizing the charge recycling circuit 624, the charges in the read bit line RBL may be partially transferred to write bit line WBL to save additional energy.

In an operation of reading "0", the pre-charge bar signal PREB may be switched to the logic high to ensure that the read bit line RBL is pre-charged to the logic high. On the other hand, the enable signal EN may be switch to the logic low to ensure that the write bit line is discharged to the logic low. Next, the read word line control signal RWL<1> may be enabled to turn on the second gain-cell transistor G2 for reading data (i.e., "0") from the storage node SN4.

In summary, according to the storage circuit 200, the storage circuit 300, and the storage circuit 600, while a refresh operation or a write operation is performed on the gain-cell 210 through the self-refresh unit 220 for the data maintenance, a read operation may be able to be performed on the gain-cell 210 through the latch circuit 230 at the same time, which brings benefits in the CIM application. Moreover, the gain-cell 210 and the self-refresh unit 220 may not occupy large areas, thereby decreasing an area overhead of the memory device 100.

In one embodiment, a storage circuit includes: a gain-cell, configured to store first data in a gate of a storage transistor; a self-refresh unit, configured to read the first data from the gain-cell and write the first data back to the gain-cell; and a latch circuit, configured to read the first data from the self-refresh unit and latch the first data.

In a related embodiment, in response to the first data being latched in the latch circuit, the gain-cell is configured to store second data.

In a related embodiment, in response to the second data being stored in the gain-cell, the latch circuit is configured to provide the first data as a computing data source for a computing-in-memory application.

In a related embodiment, the gain-cell includes: a write transistor, wherein a first terminal of the write transistor is electrically coupled to a write bit line, a second terminal of the write transistor is electrically coupled to the gate of the storage transistor, and a gate of the write transistor is electrically coupled to a write word line; a read transistor, wherein a first terminal of the read transistor is a second terminal of the storage transistor, a second terminal of the read transistor is electrically coupled to a read bit line, and a gate of the read transistor is electrically coupled to a read word line; and the storage transistor, wherein a first terminal of the storage transistor is electrically coupled to a second reference potential.

In a related embodiment, the gain-cell further includes: an enhance transistor, wherein a source and a drain of the enhance transistor are both electrically coupled to a second reference potential, and a gate of the enhance transistor is electrically coupled to a gate of the storage transistor.

In a related embodiment, the self-refresh unit includes: a refresh inverter, electrically coupled between a first reference potential and a second reference potential; and a pre-charge transistor, configured to pre-charge a read bit line to the first reference potential during a latch operation of the latch circuit and discharge a write bit line to the second reference potential during the latch operation of the latch circuit.

In a related embodiment, the refresh inverter includes: a first refresh transistor, wherein a gate of the first refresh transistor is electrically coupled to a first terminal of the pre-charge transistor, a first terminal of the first refresh transistor is electrically coupled to the second reference potential, and a second terminal of the first refresh transistor is electrically coupled to a second refresh transistor; and the second refresh transistor, wherein a gate of the second refresh transistor is electrically coupled to the first terminal of the pre-charge transistor, a first terminal of the second refresh transistor is electrically coupled to the first refresh transistor, and a second terminal of the second refresh transistor is electrically coupled to the first reference potential, and a second terminal of the pre-charge transistor is electrically coupled to the first reference terminal.

In a related embodiment, wherein the self-refresh unit further includes: a charge recycling circuit, configured to receive charges from the read bit line and provide the charges to the write bit line.

In a related embodiment, the self-refresh unit further includes: a charge recycling circuit, configured to perform a charge balance operation between a charge level of the read bit line and a charge level of the write bit line.

In a related embodiment, the charge recycling circuit includes: a first charge recycling transistor, wherein a first terminal of the first charge recycling transistor is electrically coupled to the write bit line, and a second terminal and a gate of the first charge recycling transistor are both electrically coupled to a charge recycling node; a second charge recycling transistor, wherein a first terminal of the second charge recycling transistor is electrically coupled to the second reference potential, a second terminal of the second charge recycling transistor is electrically coupled to the charge recycling node; and a gate of the second charge recycling transistor is electrically coupled to the refresh inverter and configured to receive an enable signal.

In a related embodiment, the latch circuit includes: a cross-coupled latch, comprising a weight data node and a weight data bar node; a first pass gate transistor, electrically coupled between the cross-coupled latch and a write bit line and configured to provide data of the write bit line to the weight data node; and a second pass gate transistor, electrically coupled between the cross-coupled latch and a read bit line and configured to provide data of the read bit line to the weight data bar node.

In a related embodiment, during a latch operation, a timing of the first pass gate transistor being turned on is earlier than a timing of the second pass gate transistor being turned on.

In a related embodiment, the cross-coupled latch includes: two P-type transistors and two N-type transistors, wherein driving currents of the two P-type transistors are weaker than the two N-type transistors.

In a related embodiment, wherein the self-refresh unit includes: a header transistor, electrically coupled between the cross-coupled latch and a first reference potential and configured to disconnect the cross-coupled latch from the first reference potential based on a pass gate signal.

In one embodiment, a self-refresh unit is electrically coupled between a gain-cell and a latch circuit, wherein the self-refresh unit includes: a refresh inverter, electrically coupled between a first reference potential and a second reference potential; and a pre-charge transistor, configured to pre-charge a read bit line to the first reference potential during a latch operation of the latch circuit and discharge a write bit line to the second reference potential during the latch operation of the latch circuit, wherein the self-refresh unit is configured to read the first data from the gain-cell and write the first data back to the gain-cell, and the self-refresh unit is configured to provide the first data to the latch circuit for latching the first data.

In a related embodiment, in response to the first data being latched in the latch circuit, the gain-cell is configured to store second data.

In a related embodiment, in response to the second data being stored in the gain-cell, the latch circuit is configured to provide the first data as a computing data source for a computing-in-memory application.

In a related embodiment, the self-refresh unit further includes: a charge recycling circuit, configured to receive charges from the read bit line and provide the charges to the write bit line.

In a related embodiment, the self-refresh unit further includes: a charge recycling circuit, configured to perform a charge balance operation between a charge level of the read bit line and a charge level of the write bit line.

In one embodiment, a memory array includes: a plurality of gain-cells, arranged in a matrix of rows and columns, wherein each of the plurality of gain-cells is configured to store first data in a gate of a storage transistor; a plurality of self-refresh units, wherein each of the plurality of self-refresh units is electrically coupled to a column of the gain-cells and is configured to read the first data from the column of gain-cells and write the first data back to the column of gain-cells; and a plurality of latch circuits, wherein each of the plurality of latch circuits is electrically coupled to a column of the gain-cells and is configured to read the first data from the each of the plurality of self-refresh units and latch the first data.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A storage circuit, comprising:
a gain-cell, configured to store first data in a gate of a storage transistor;
a self-refresh unit, configured to read the first data from the gain-cell and write the first data back to the gain-cell and comprises:
a refresh inverter, electrically coupled between a first reference potential and a second reference potential; and
a pre-charge transistor, configured to pre-charge a read bit line to the first reference potential during a latch operation of a latch circuit and discharge a write bit line to the second reference potential during the latch operation of the latch circuit; and
the latch circuit, configured to read the first data from the self-refresh unit and latch the first data.

2. The storage circuit according to claim 1, wherein in response to the first data being latched in the latch circuit, the gain-cell is configured to store second data.

3. The storage circuit according to claim 2, wherein in response to the second data being stored in the gain-cell, the latch circuit is configured to provide the first data as a computing data source for a computing-in-memory application.

4. The storage circuit according to claim 1, wherein the gain-cell comprises:
a write transistor, wherein
a first terminal of the write transistor is electrically coupled to a write bit line,
a second terminal of the write transistor is electrically coupled to the gate of the storage transistor, and
a gate of the write transistor is electrically coupled to a write word line;
a read transistor, wherein
a first terminal of the read transistor is electrically coupled to a second terminal of the storage transistor,
a second terminal of the read transistor is electrically coupled to a read bit line, and
a gate of the read transistor is electrically coupled to a read word line; and
the storage transistor, wherein
a first terminal of the storage transistor is electrically coupled to a second reference potential.

5. The storage circuit according to claim 4, wherein the gain-cell further comprises:
an enhance transistor, wherein
a source and a drain of the enhance transistor are both electrically coupled to the second reference potential, and
a gate of the enhance transistor is electrically coupled to the gate of the storage transistor.

6. The storage circuit according to claim 1, wherein the refresh inverter comprises:
a first refresh transistor, wherein
a gate of the first refresh transistor is electrically coupled to a first terminal of the pre-charge transistor,
a first terminal of the first refresh transistor is electrically coupled to the second reference potential, and
a second terminal of the first refresh transistor is electrically coupled to a second refresh transistor; and
the second refresh transistor, wherein
a gate of the second refresh transistor is electrically coupled to the first terminal of the pre-charge transistor,
a first terminal of the second refresh transistor is electrically coupled to the second terminal of the first refresh transistor, and
a second terminal of the second refresh transistor is electrically coupled to the first reference potential, and wherein
a second terminal of the pre-charge transistor is electrically coupled to the first reference terminal.

7. The storage circuit according to claim 1, wherein the self-refresh unit further comprises:
a charge recycling circuit, configured to perform a charge balance operation between a charge level of the read bit line and a charge level of the write bit line.

8. The storage circuit according to claim 1, wherein the self-refresh unit further comprises:
a charge recycling circuit, configured to receive charges from the read bit line and provide the charges to the write bit line.

9. The storage circuit according to claim 8, wherein the charge recycling circuit comprises:
a first charge recycling transistor, wherein
a first terminal of the first charge recycling transistor is electrically coupled to the write bit line, and
a second terminal and a gate of the first charge recycling transistor are both electrically coupled to a charge recycling node;
a second charge recycling transistor, wherein
a first terminal of the second charge recycling transistor is electrically coupled to the second reference potential,
a second terminal of the second charge recycling transistor is electrically coupled to the charge recycling node; and
a gate of the second charge recycling transistor is electrically coupled to the refresh inverter and configured to receive an enable signal.

10. The storage circuit according to claim 1, wherein the latch circuit comprises:
a cross-coupled latch, comprising a weight data node and a weight data bar node;
a first pass gate transistor, electrically coupled between the cross-coupled latch and a write bit line and configured to provide data of the write bit line to the weight data node; and
a second pass gate transistor, electrically coupled between the cross-coupled latch and a read bit line and configured to provide data of the read bit line to the weight data bar node.

11. The storage circuit according to claim 10, wherein during a latch operation, a timing of the first pass gate transistor being turned on is earlier than a timing of the second pass gate transistor being turned on.

12. The storage circuit according to claim 10, wherein the cross-coupled latch comprises:
two P-type transistors and two N-type transistors, wherein driving currents of the two P-type transistors are weaker than driving currents of the two N-type transistors.

13. The storage circuit according to claim 10, wherein the self-refresh unit comprises
a header transistor, electrically coupled between the cross-coupled latch and a first reference potential and configured to disconnect the cross-coupled latch from the first reference potential based on a pass gate signal.

14. A self-refresh unit, electrically coupled between a gain-cell and a latch circuit, wherein the self-refresh unit comprises:

a refresh inverter, electrically coupled between a first reference potential and a second reference potential; and a pre-charge transistor, configured to pre-charge a read bit line to the first reference potential during a latch operation of the latch circuit and discharge a write bit line to the second reference potential during the latch operation of the latch circuit, wherein the self-refresh unit is configured to read first data from the gain-cell and write the first data back to the gain-cell, and the self-refresh unit is configured to provide the first data to the latch circuit for latching the first data.

15. The self-refresh unit according to claim 14, wherein in response to the first data being latched in the latch circuit, the gain-cell is configured to store second data.

16. The self-refresh unit according to claim 15, wherein in response to the second data being stored in the gain-cell, the latch circuit is configured to provide the first data as a computing data source for a computing-in-memory application.

17. The self-refresh unit according to claim 14, wherein the self-refresh unit further comprises:

a charge recycling circuit, configured to receive charges from the read bit line and provide the charges to the write bit line.

18. The self-refresh unit according to claim 14, wherein the self-refresh unit further comprises:

a charge recycling circuit, configured to perform a charge balance operation between a charge level of the read bit line and a charge level of the write bit line.

19. A memory array, comprising:

a plurality of gain-cells, arranged in a matrix of rows and columns, wherein each of the plurality of gain-cells is configured to store first data in a gate of a storage transistor;

a plurality of self-refresh units, wherein each of the plurality of self-refresh units is electrically coupled to a column of the gain-cells and is configured to read the first data from the column of the gain-cells and write the first data back to the column of the gain and each of the plurality of self-refresh units comprises:

a refresh inverter, electrically coupled between a first reference potential and a second reference potential; and a pre-charge transistor, configured to pre-charge a read bit line to the first reference potential during a latch operation of one of a plurality of latch circuits and discharge a write bit line to the second reference potential during the latch operation of the one of the plurality of latch circuits; and the plurality of latch circuits, wherein each of the plurality of latch circuits is electrically coupled to the column of the gain-cells and is configured to read the first data from each of the plurality of self-refresh units and latch the first data.

20. The memory array according to claim 19, wherein in response to the first data being latched in the latch circuit, the plurality of gain-cells are configured to store second data.

* * * * *